United States Patent
Van Der Veen et al.

(10) Patent No.: US 12,308,069 B2
(45) Date of Patent: May 20, 2025

(54) DRAM WITH QUICK RANDOM ROW REFRESH FOR ROWHAMMER MITIGATION

(71) Applicant: QUALCOMM Incorporated, San Diego, CA (US)

(72) Inventors: Victor Van Der Veen, Amsterdam (NL); Mosaddiq Saifuddin, San Diego, CA (US); Pankaj Deshmukh, San Diego, CA (US); Behnam Dashtipour, San Diego, CA (US); David Hartley, Berlin (DE)

(73) Assignee: QUALCOMM Incorporated, San Diego, CA (US)

( * ) Notice: Subject to any disclaimer, the term of this patent is extended or adjusted under 35 U.S.C. 154(b) by 332 days.

(21) Appl. No.: 17/445,220

(22) Filed: Aug. 17, 2021

(65) Prior Publication Data

US 2022/0129200 A1    Apr. 28, 2022

Related U.S. Application Data

(60) Provisional application No. 63/105,621, filed on Oct. 26, 2020.

(51) Int. Cl.
  *G06F 11/00*       (2006.01)
  *G11C 11/406*      (2006.01)
  *G11C 11/4078*     (2006.01)

(52) U.S. Cl.
  CPC .... *G11C 11/4078* (2013.01); *G11C 11/40603* (2013.01); *G11C 11/40611* (2013.01)

(58) Field of Classification Search
  CPC .......... G11C 11/4078; G11C 11/40603; G11C 11/40611
  See application file for complete search history.

(56) References Cited

U.S. PATENT DOCUMENTS

| | | | |
|---|---|---|---|
| 6,212,652 B1* | 4/2001 | Williams | G01R 31/3177 714/25 |
| 6,373,769 B1* | 4/2002 | Kiehl | G11C 11/406 365/230.03 |
| 9,449,671 B2* | 9/2016 | Crawford | G06F 13/1636 |
| 2003/0112677 A1* | 6/2003 | Lehmann | G11C 11/4094 365/203 |
| 2005/0207499 A1* | 9/2005 | Hwang | H04N 19/176 375/E7.176 |
| 2006/0098514 A1* | 5/2006 | Kang | G11C 7/06 365/230.03 |
| 2007/0033338 A1* | 2/2007 | Tsern | G11C 29/50016 711/106 |

(Continued)

OTHER PUBLICATIONS

International Search Report and Written Opinion—PCT/US2021/046731—ISA/EPO—Nov. 9, 2021.

*Primary Examiner* — Loan L. T. Truong
(74) *Attorney, Agent, or Firm* — Haynes and Boone, LLP /Qualcomm

(57) ABSTRACT

A DRAM memory controller is provided that identifies a marker command directed to a given row in a DRAM. If a threshold probability is satisfied in response to an identification of the marker command, the DRAM memory controller commands the DRAM to refresh a neighboring row in the DRAM. The neighboring row may be a neighboring of the given row or of a recently-closed row.

30 Claims, 6 Drawing Sheets

(56) References Cited

U.S. PATENT DOCUMENTS

| | | | |
|---|---|---|---|
| 2009/0049455 A1* | 2/2009 | Ito | G06F 1/3203 |
| | | | 714/763 |
| 2011/0102073 A1* | 5/2011 | Riho | H04L 25/0278 |
| | | | 327/541 |
| 2011/0283060 A1* | 11/2011 | Ware | G06F 13/1689 |
| | | | 711/E12.001 |
| 2014/0095780 A1 | 4/2014 | Bains et al. | |
| 2014/0156923 A1* | 6/2014 | Bains | G11C 11/40611 |
| | | | 711/106 |
| 2014/0192605 A1* | 7/2014 | Crawford | G06F 3/0673 |
| | | | 365/222 |
| 2014/0281206 A1 | 9/2014 | Crawford et al. | |
| 2014/0314389 A1* | 10/2014 | Mese | H04N 21/8456 |
| | | | 386/241 |
| 2015/0016203 A1* | 1/2015 | Sriramagiri | G11C 11/40611 |
| | | | 365/222 |
| 2015/0022538 A1* | 1/2015 | Munshi | G06F 9/5027 |
| | | | 345/522 |
| 2017/0117030 A1* | 4/2017 | Fisch | G11C 11/4078 |
| 2018/0114561 A1 | 4/2018 | Fisch et al. | |
| 2019/0066759 A1* | 2/2019 | Nale | G11C 11/40618 |
| 2019/0214075 A1* | 7/2019 | Chen | G06F 3/0673 |
| 2019/0228813 A1* | 7/2019 | Nale | G11C 11/40611 |
| 2019/0228815 A1* | 7/2019 | Morohashi | G11C 16/349 |
| 2019/0333573 A1* | 10/2019 | Shin | G11C 11/408 |
| 2019/0361677 A1* | 11/2019 | Tu | G06F 7/584 |
| 2020/0294569 A1* | 9/2020 | Wu | G11C 11/4078 |
| 2021/0012832 A1* | 1/2021 | Devaux | G06F 13/1668 |
| 2021/0358540 A1* | 11/2021 | Brandl | G11C 11/40615 |
| 2021/0390998 A1* | 12/2021 | SeyedzadehDelcheh | |
| | | | G06F 12/121 |
| 2022/0188024 A1* | 6/2022 | Brandl | G06F 3/0604 |
| 2022/0189532 A1* | 6/2022 | Nale | G11C 11/40611 |

* cited by examiner

DRAM WITH QUICK RANDOM ROW REFRESH FOR ROWHAMMER MITIGATION

CROSS REFERENCE TO RELATED APPLICATION

The present application claims priority to U.S. Provisional Patent Application No. 63/105,621, filed Oct. 26, 2020, which is hereby incorporated by reference in its entirety.

TECHNICAL FIELD

This application relates to DRAM memory controllers, and more particularly to a DRAM memory controller with quick random row refresh to mitigate rowhammer-induced data disturbances.

BACKGROUND

As compared to static random access memory (SRAM), a dynamic random access memory (DRAM) is denser and thus less expensive for unit of memory storage. Modern integrated circuits such as a system-on-a-chip thus often include a DRAM memory controller so that a DRAM integrated circuit may be accessed for data storage. Although DRAM is thus a common memory architecture, a DRAM bit cell does not store data as robustly as an SRAM bitcell. An SRAM bitcell stores its bit using a pair of cross-coupled inverters. The cross-coupled inverters are powered and thus may be referred to as active devices. But a DRAM bitcell stores its bit as charge on a passive capacitor. The capacitor constantly leaks charge so that a DRAM bitcell must be refreshed periodically or its stored bit becomes corrupted.

Although DRAM protects its data using periodic refresh cycles, the passive nature of its bitcells leaves it prone to disturbance as compared to SRAM. DRAM bitcells are arranged in rows that share a common word line. To access a row, the word line voltage is asserted so that the row's bitcells may receive a write operation or a read operation. The assertion of a row's word line can induce leakage from bitcells in the adjacent rows. A repeated assertion of a word line to a given row prior to a refresh cycle for the adjacent rows may thus corrupt the stored bits in bitcells in the adjacent rows. This disturbance is commonly denoted as "rowhammer." To mitigate rowhammer, it was proposed to include in the DRAM a counter for each row that counts its row access and is reset when its row is refreshed. Should the count reach a threshold, the DRAM then executes a refresh for the affected row. Alternatively, the counters may be in the memory controller as opposed to being in the DRAM. But the counter-based approach for rowhammer mitigation may be burdensome due to the number of counters it requires.

SUMMARY

A memory controller for a dynamic random access memory (DRAM) is provided that includes: a logic circuit configured to identify a marker command directed to a given row in the DRAM; a probability engine configured to determine whether a threshold probability is satisfied responsive to an identification of the marker command; and a command generator configured to signal the DRAM to refresh at least one row outside of the given row in response to a satisfaction of the threshold probability.

A method for a DRAM memory controller is provided that includes: identifying a marker command directed to a given row in a DRAM; in response to an identification of the marker command, determining whether the identification of the marker command is associated with a threshold probability; and in response to the threshold probability being satisfied, issuing a command to the DRAM to refresh a neighboring row in the DRAM.

A memory controller for a DRAM is provided that includes: a command queue configured to queue a plurality of commands to the DRAM to form a queue of commands; a first pipeline configured to pipeline the queue of command to form a plurality of pipelined commands; a logic circuit configured to identify a marker command in the plurality of pipelined commands; a probability engine configured to determine whether a threshold probability is satisfied responsive to an identification of the marker command; and a command generator configured to modify a command in the plurality of pipelined commands to form a modified command in response to a satisfaction of the threshold probability, the modified command being a command to the DRAM to refresh one or more rows.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
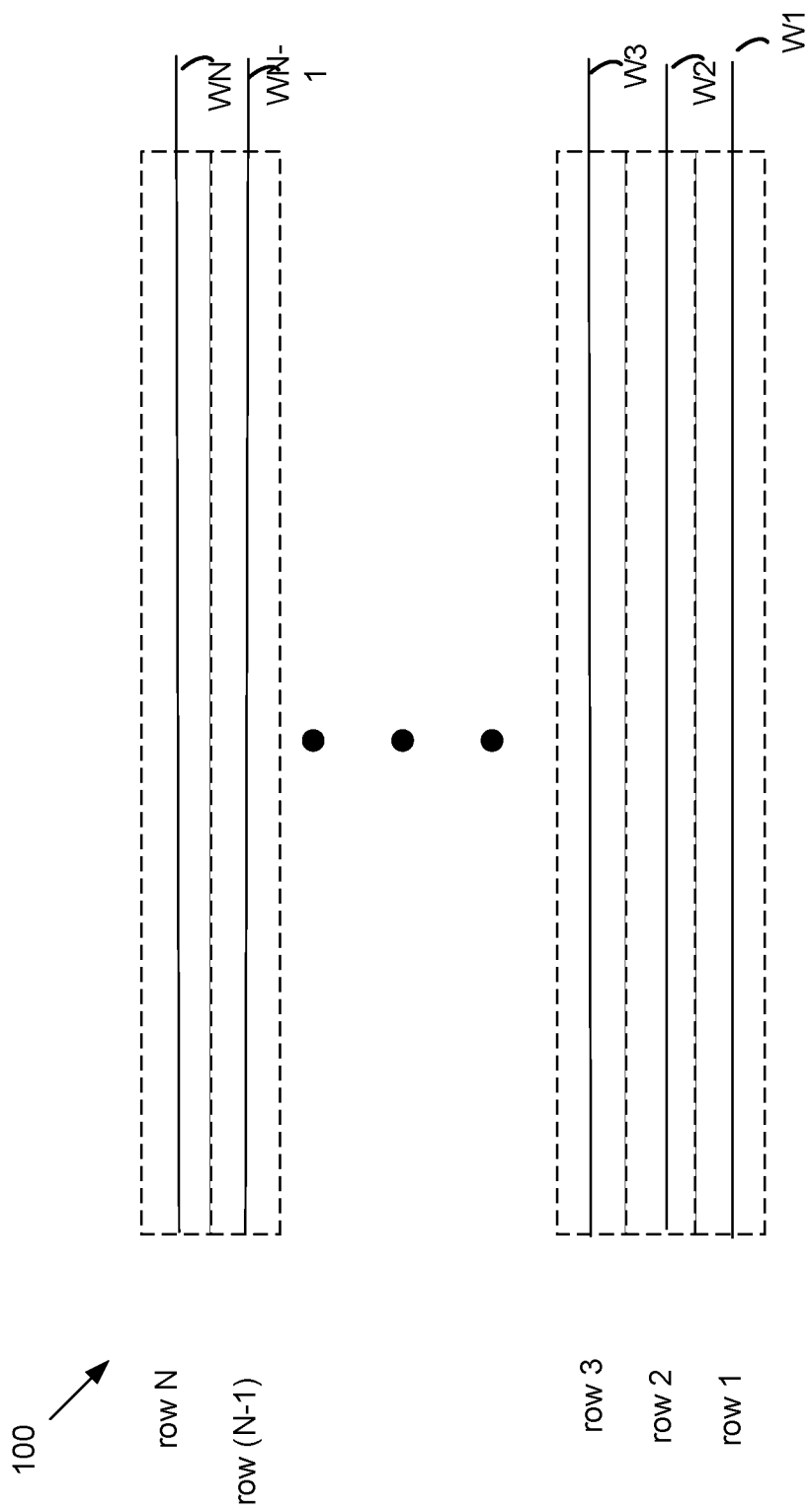
FIG. 1 is an illustration of an example DRAM memory array.

To provide a better appreciation of the innovative rowhammer refresh management disclosed herein, an example DRAM array 100 will first be discussed with reference to FIG. 1. DRAM array 100 includes a plurality of N rows of bitcells ranging from a row 1 to a row N. For illustration clarity, only the first three rows and the last two rows are shown in FIG. 1. Row 1 and the row N have only one neighboring or adjacent row. The remaining rows will have two adjacent rows. For example, row 2 in the array 100 is neighbored by row 1 and a row 3. Each row is accessed by a corresponding word line. There is thus a word line W1 for row 1, a word line W2 for row 2, a word line W3 for row 3, and so on such that there is a word line WN-1 for the row (N-1) and a word line WN for the row N.

As defined herein, a row is deemed to be open when its word line voltage is asserted. In general, this assertion involves the charging of the accessed row's word line from ground to a power supply voltage, but other voltages may be used in alternative implementations. As defined by the Joint Electron Device Engineering Council (JEDEC), a row access may occur responsive to an activation command that is commonly abbreviated as ACT. With the word line opened, the data in the accessed row may be read (a read operation) or changed (a write operation). The word line is then closed (e.g., discharged to ground) responsive to a JEDEC pre-charge command that is commonly abbreviated as PRE.

As discussed previously, a DRAM row is periodically refreshed due to the leakage from each bitcell's capacitor that stores the bitcell's bit. A refresh involves both an activation and a pre-charge. The activation occurs so that contents of the row may be sensed by a corresponding set of sense amplifiers. The sense amplifiers latch the sensed bits so that these sensed bits may be re-written to the refreshed row during the subsequent pre-charge. But this refresh takes time and may not be done simultaneously for more than one row in any given array.

In an array of DRAM rows, the refresh applies only to one row so that a refresh of all the rows takes multiple refresh cycles. Since the sense amplifiers are occupied during the refresh, the memory array cannot be written to or read from during a refresh cycle. The refreshing of any given row must thus be spaced apart in time according to a refresh rate so that the memory array may be used during read and write operations. The refresh rate cannot be so slow, however, such that the bitcells lose their stored bits due to leakage. Given this refresh rate, there is a period of time during which the row must retain its data without an intervening refresh. During this time between refreshes to a given row, an adjacent row may be repeatedly accessed. For example, suppose that row 2 in array 100 is repeatedly accessed before either row 1 or row 3 is refreshed. This repeated assertion of the word line W2 can cause a parasitic assertion of word line W1 and/or word line W3. The bitcells in either row 1 or row 2 may then be subjected to excessive leakage due to the partial assertion of their corresponding word line such that their stored data becomes corrupted. As discussed previously, this data disturbance is referred to as rowhammer.

A DRAM memory controller is disclosed that mitigates rowhammer data disturbance. To distinguish this advantageous DRAM memory controller from conventional DRAM memory controllers, the DRAM memory controllers disclosed herein are denoted as rowhammer-mitigating DRAM memory controllers. Like any DRAM memory controller, a rowhammer-mitigating memory controller converts memory access requests into a series of commands to its associated DRAM such as commands relating to read and write operations. As discussed previously, two example commands are PRE and ACT. There are other types of commands in the JEDEC standard such as a read command with automatic pre-charge (RDA) or a write command with automatic pre-charge (WDA). There are thus various types of JEDEC commands: PRE, ACT, RDA, WDA, and so on. To mitigate the corruption of stored data by rowhammer, one type of command is designated herein as a marker command. A marker command as used herein refers to a command that triggers a rowhammer-mitigating memory controller to perform an evaluation of whether a refresh neighbor command should be generated. A refresh neighbor command may be abbreviated as an RFN command. The RFN command is directed to a row in the DRAM memory array denoted herein as an RFN row. When received at the DRAM, the DRAM refreshes one or more neighboring rows that neighbor the RFN row as will be explained further herein. The marker command may be an existing JEDEC command in some implementations. Such marker commands are denoted herein as unmodified marker commands. In other implementations, the marker command may be a modified form of an existing JEDEC command. Such marker commands are denoted herein as modified marker commands.

A discussion of a rowhammer-mitigating DRAM memory controller will now be provided that is generic to both modified and unmodified marker command implementations. In that regard, the term "marker command" without any designation as being modified or unmodified shall be understood to be generic to both implementations. To provide enhanced rowhammer mitigation, a rowhammer-mitigating DRAM memory controller responds with a threshold probability to the identification of a marker command by generating an RFN command. Note that a row refresh in the DRAM uses power and may slow operation of the DRAM. It would thus be undesirable to generate an RFN command every time a marker command is identified. In that case, the probability of generating an RFN command responsive to the identification of a marker command would be 100%. A rowhammer-mitigating memory controller thus generates an RFN command only with a threshold probability in response to the identification of the marker command. What constitutes a threshold probability depends upon the DRAM design and implementation, but it may be assumed herein that a "threshold probability" is less than a 50% probability. Note that the choice of the threshold probability involves a tradeoff between the rowhammer mitigation that generating an RFN command provides versus the DRAM power consumption and speed reduction that ensues from the additional row refresh operations.

Figure 2:
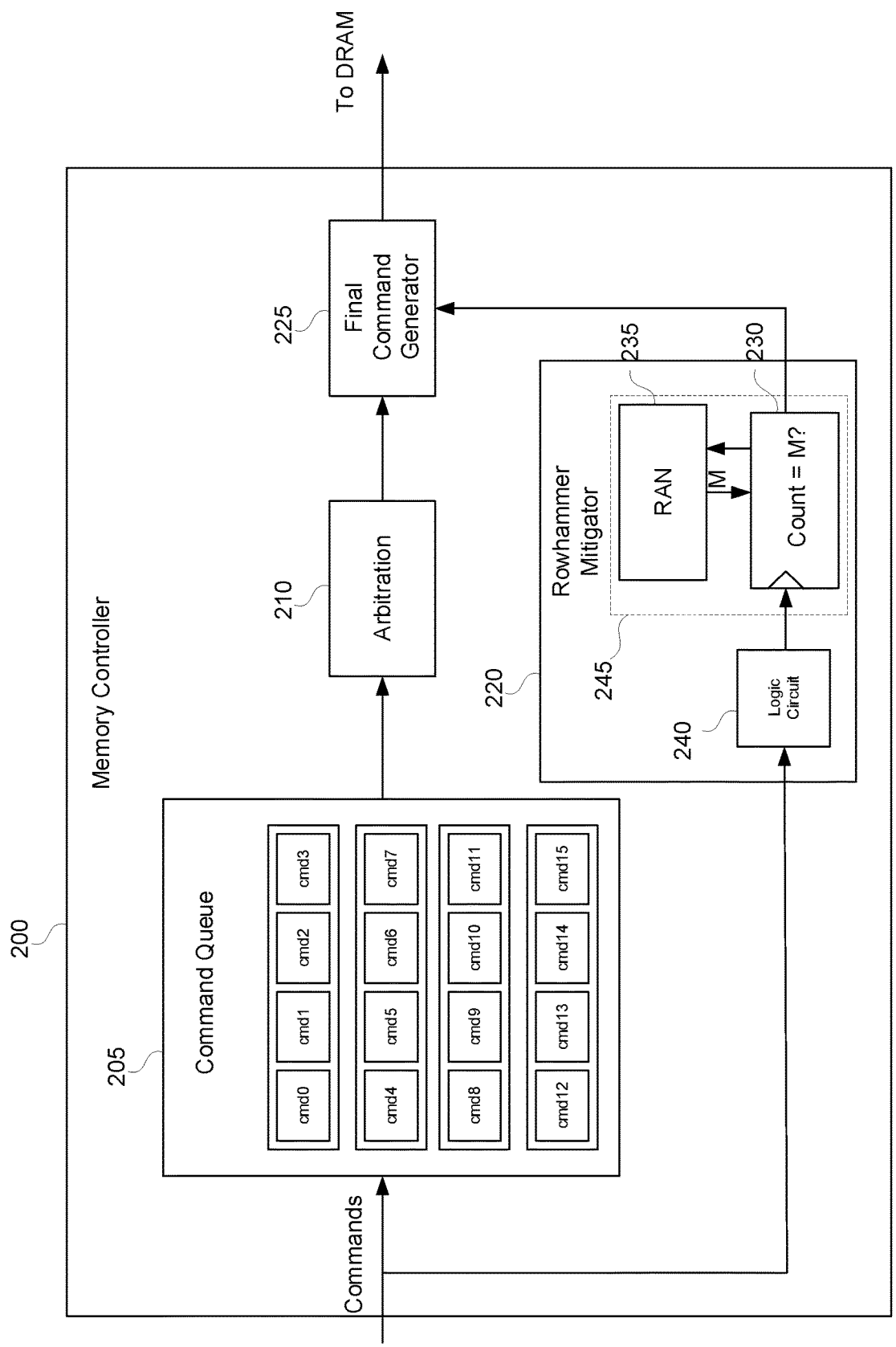
FIG. 2 illustrates a memory controller with rowhammer mitigation in accordance with a first aspect of the disclosure.

An example rowhammer-mitigating DRAM memory controller 200 is shown in FIG. 2. Controller 200 receives memory access requests that may also be denoted as commands. Controller 200 stores a set of the commands as they are received in a command queue 205. The number of commands stored in command queue 205 may vary depending upon the particular design requirements. For illustration purposes, command queue 205 is shown storing sixteen commands ranging from a zero command cmd0 to a fifteenth command cmd15 but it will be appreciated that fewer or greater number of commands may be stored in the command queue 205 in alternative implementations. An arbitrator 210 selects commands from the command queue 205 according to the command's priority. A final command generator 225 converts the selected commands from arbitrator 210 into DRAM commands for a DRAM (not illustrated). In general, the DRAM command as generated by final command generator 225 will depend upon the architecture of the DRAM whereas the commands processed by command queue 205 and arbiter 210 are typically independent of the DRAM implementation.

Those of ordinary skill in the DRAM memory controller arts will appreciate that it is known for a DRAM memory controller to include some form of a command queue, an arbiter, and a final command generator. In that regard, command queue 205, arbiter 210, and final command generator 225 may function in a conventional fashion in some embodiments with regard to the processing of non-marker commands. But some of the commands will be marker commands depending upon the type of memory access request that were translated. A rowhammer mitigator 220 in memory controller 200 may include a logic circuit 240 that identifies the presence of a marker command in the commands being presented to command queue 205. For each marker command instance such as identified by logic circuit 240, rowhammer mitigator 220 determines whether the threshold probability was satisfied using a probability engine 245. A particularly advantageous implementation of this probability engine 245 results from the use of a random number generator 235 and a counter 230. The random number generator 235 generates an integer random number M that ranges from 0 to a maximum count (m max) value. The counter 230 would then increment a count starting from zero (or from some non-zero positive integer) for each successive identification of a marker command. For example, suppose logic circuit 240 identifies a first instance of the marker command. The counter 230 is then initialized to begin counting additional instances of the marker command. Once the count reaches M, probability engine 245 triggers final command generator 225 to insert an RFN command into the stream of DRAM commands being sent to the DRAM and triggers random number generator 235 to generate a new random number M. The threshold probability is thus satisfied by the counting of the Mth marker command. Marker commands that do not satisfy the threshold probability and non-marker commands will also pass through controller 200 and become final commands that are issued to the DRAM by final command generator 225. But it is only a marker command that satisfies the threshold probability that triggers an RFN command to be sent to the DRAM. Note that the triggering marker command (in this example, the Mth marker command as counted by counter 230) and the RFN command are two distinct commands, even in implementations in which the RFN command is a modified marker command. In some implementations, however, the triggering marker command and the RFN command may be combined to form a single DRAM command.

Figure 3:
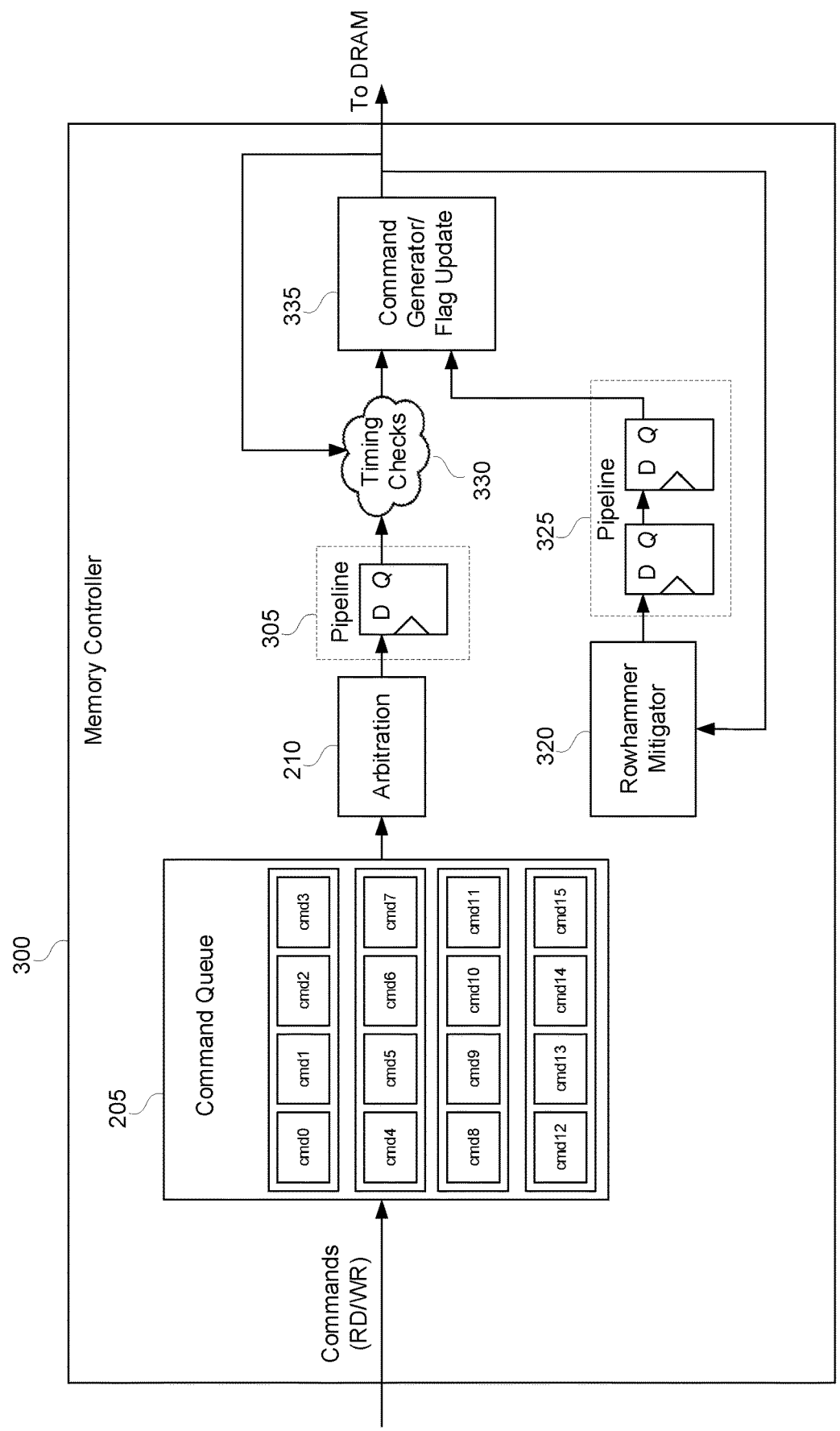
FIG. 3 illustrates a memory controller with rowhammer mitigation in accordance with a second aspect of the disclosure.

Numerous modifications may be made to controller 200 to provide rowhammer mitigation in accordance with the present disclosure. Another example memory controller 300 is shown in FIG. 3. Command queue 205 and arbitrator 210 are as discussed for memory controller 200. The arbitrated commands from arbitrator 210 may be pipelined in a pipeline 305 before passing through a timing check circuit 330 to become a DRAM command as generated by a final command generator 335 that may or may not include a flag update. In controller 300, a rowhammer mitigator 320 may function as discussed for rowhammer mitigator 220 except that rowhammer mitigator 320 processes the DRAM commands issued by final command generator 335. Should a DRAM command 335 from final command generator 335 satisfy the threshold probability, rowhammer mitigator 320 signals final command generator 335 to insert an RFN command. For example, final command generator 335 may assert a flag in a DRAM command to perform the RFN command insertion. Note that outgoing DRAM commands to the DRAM from final command generator 335 are not changed so RFN commands will be issued as a subsequent DRAM command as compared to the DRAM command that satisfied the threshold probability as determined by rowhammer mitigator 320. Since rowhammer mitigator 320 may process commands that target different banks in the DRAM, the control from rowhammer mitigator 320 may be pipelined through a pipeline 325 to ensure proper scheduling of per-bank commands. Timing check circuit 330 processes the last issued DRAM command from final command generator 335 to determine how much time or delay should pass before another DRAM command is issued. Timing check circuit 330 may increase this delay should the last issued DRAM command be an RFN command to give the DRAM sufficient time to refresh the neighboring rows.

Figure 4:
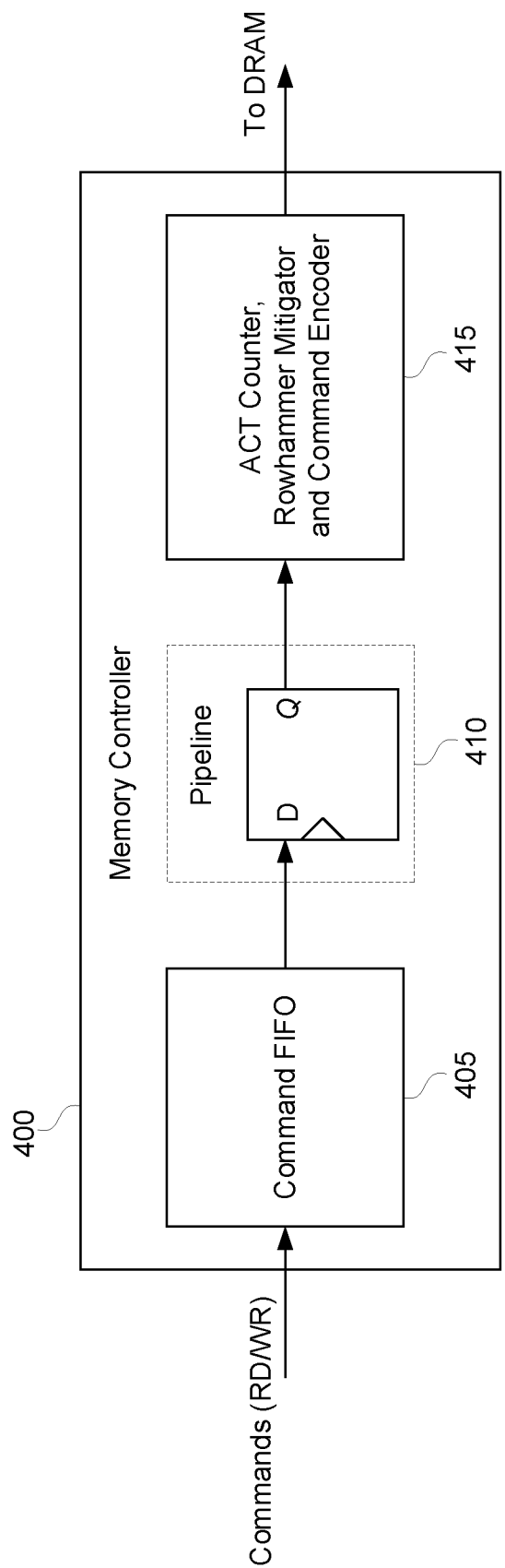
FIG. 4 illustrates a memory controller with rowhammer mitigation in accordance with a third aspect of the disclosure.

Yet another example memory controller 400 is shown in FIG. 4. Command first-in-first-out (FIFO) 405 functions as discussed with regard to command queue 205. Commands from FIFO 405 are pipelined in a pipeline 410. A rowhammer mitigator 415 includes an ACT counter to count the instances of the ACT command. Should the ACT command count satisfy the random number m as discussed for rowhammer mitigator 220, rowhammer mitigator 415 processes the ACT command to become an ACT RFN command. Such an ACT RFN command may be a modified or an unmodified marker command. In an alternative implementation, a rowhammer mitigator may be stateless such that there is no count performed. For example, rowhammer mitigator 415 may simply generate a random number based upon the identification of an ACT command in the queue from pipeline 410. If the random number satisfies a threshold probability, the ACT command would then be converted into an ACT RFN command.

Modified and unmodified marker command implementations will now be discussed in more detail starting with a discussion of modified marker command implementations.
Rowhammer Mitigation with Modified Marker Commands A modified marker command may be a modification of an existing JEDEC command so as to include an RFN field. The RFN field has a true/false state depending upon whether the threshold probability was satisfied. For example, a conventional PRE command may be modified to include the RFN field to form an example modified marker command designated herein as $PRE_{RFN}$. Due to the low probability of generating an RFN command, most $PRE_{RFN}$ commands would function as conventional PRE commands with their RFN field set to false. But if the threshold probability is satisfied, the RFN field is set true such that the $PRE_{RFN}$ command also functions as an RFN command. As discussed previously, the neighboring rows that are refreshed in the DRAM are neighbors of the RFN row. For a modified marker command implementation, the RFN row corresponds to the row addressed by the modified marker command prior to the setting of the RFN field to true. The RFN row for a $PRE_{RFN}$ command is thus the row that is being pre-charged in the DRAM responsive to the $PRE_{RFN}$ command. If the RFN field is false, the DRAM responds to the $PRE_{RFN}$ command as it would to a conventional PRE command such that it pre-charges the same row that would be pre-charged by a corresponding conventional PRE command. But if the RFN field is true, the DRAM responds to the $PRE_{RFN}$ command by not only pre-charging the addressed row but also by refreshing both neighboring rows to this RFN row. In other implementations, the DRAM responds to the $PRE_{RFN}$ command by pre-charging the addressed row and also by refreshing just one of the neighboring rows as will be explained further herein.

Rather than modify the PRE command, another example of a modified marker command may be formed by a modification of an ACT command to include the RFN field. Rowhammer mitigator 415 may produce such a modified ACT command. A modified ACT command may be designated herein as $ACT_{RFN}$. Just as discussed with the $PRE_{RFN}$ example, the majority of $ACT_{RFN}$ commands would be processed in a conventional fashion such that their RFN fields remain false. But if the threshold probability is satisfied, the RFN field is set to true. In that case, the $ACT_{RFN}$ command not only functions as an ACT command but also functions as an RFN command such that DRAM would be triggered to refresh one or more neighboring rows to the RFN row that is being activated by the $ACT_{RFN}$ command.

Note that a PRE command may be integrated with a read or a write command. For example, a read command with an automatic pre-charge in the JEDEC standard is denoted as a read auto-pre-charge (RDA) command. Similarly, a write auto-pre-charge command is abbreviated as a WDA. A write mask auto-pre-charge command is abbreviated as WMA. These auto pre-charge commands thus inherently include a PRE command as part of their execution. As discussed with regard to the $PRE_{RFN}$ command, conventional (existing) auto-pre-charge commands may be modified to include an RFN field to become modified auto pre-charge commands.

Rowhammer Mitigation with Unmodified Marker Commands

In this implementation, the marker command is a conventional JEDEC command. The RFN command is an entirely new command to the JEDEC standard in an unmodified marker command implementation. The unmodified marker command may be any type of conventional JEDEC command such as an ACT command, a PRE command, and so on. A rowhammer mitigator as discussed herein may react to the identification of the unmodified marker command by inserting the RFN command as one of the DRAM commands that are issued to the DRAM. As may occur for the modified marker commands, notice that the RFN row may then be de-coupled from the row addressed by the unmodified marker command. In some implementations, the RFN row may indeed be the same row as addressed by the unmodified marker command. But in other implementations, the RFN row may instead be a recently-closed row (e.g., the most-recently closed row, a next-to-most recently closed row, and so on). The DRAM would then refresh both (or just one) neighbor to this recently-closed row in response to receiving the RFN command.

Regardless of whether the marker command is a modified marker command or an unmodified marker command, the resulting RFN command may trigger the refresh of both neighboring rows to the RFN row or just one. Implementations that trigger the refresh of both neighboring rows will be discussed first followed by a discussion of implementations that refresh only one neighboring row.

Refreshing Both Neighboring Rows

An RFN command that triggers the refresh of both neighboring rows may take a number of forms depending upon whether the marker command is modified or unmodified. For example, the modified marker command may be a $PRE_{RFN}$ command or an $ACT_{RFN}$ command as discussed previously. In a both-neighboring-row-refresh implementation, the $PRE_{RFN}$ command triggers a refresh of both neighboring rows to the row being pre-charged. Similarly, the $ACT_{RFN}$ command triggers a refresh of both neighboring rows to the row being activated.

In an unmodified marker command implementation, one implementation of the new RFN command may be designated as $RFN_{PREV}$ as it instructs the DRAM to refresh the neighboring rows to the recently-closed row. Whether this recently-closed row is the most-recently closed row, a next-to-most recently closed row, and so on depends upon the implementation. There are thus no parameters associated with $RFN_{PREV}$. Another new RFN command may be designated as $RFN_{ROW}$ that is issued before an ACT command or after a PRE command. The $RFN_{PREV}$ and $RFN_{ROW}$ commands may be issued after an auto pre-charge command. The $RFN_{ROW}$ command includes the row address of the RFN row. In response to the $RFN_{ROW}$ command, the DRAM refreshes the neighboring rows to the RFN row as identified by the row address within the $RFN_{ROW}$ command.

Refreshing Only One Neighboring Row

Referring again to array 100, note that a neighboring row such as row 3 that is above row 2 may be deemed to be to the left of the row 2. Conversely, row 1 may be deemed to be to the right of row 2. Except for row 1 and row N, all the remaining rows would similarly have a left row neighbor and a right row neighbor. Whether it is the left neighboring row or the right neighboring row that is to be refreshed responsive to an RFN command in an only-one-neighboring-row refresh implementation may be determined by a register in the rowhammer mitigator 220. This register toggles between two values (e.g., between 0 and 1) every time the threshold probability is satisfied. One value (e.g., 0) may be assigned to select for the left neighboring row and the remaining value (e.g., 1) may be assigned to select for the right neighboring row. The preceding example RFN commands may be modified accordingly. For example, the modified marker command may be a modified PRE command. The existing PRE command from the JEDEC standard is modified to include two extra bits. One bit indicates that a neighboring row should be refreshed (or not) and the other bit indicates whether it is the left neighboring row or the right. Similarly, the ACT command may be modified in the same fashion. In addition, the RDA, WDA, and WMA commands may also be modified to include this two-parameter field.

Alternatively, the $RFN_{PREV}$ command discussed previously may be modified to include a left/right field that identifies whether it is the left or the right neighboring row that is to be refreshed. The DRAM would then refresh the neighboring row to the recently-closed row accordingly. Similarly, the $RFN_{ROW}$ command discussed previously may be modified to also include a left/right field in addition to the row address. The DRAM would then refresh the appropriate neighboring row according to the row address.

Manual Refresh

In the previous examples, the DRAM identifies the neighboring rows as it knows the location of the RFN row. In a manual refresh alternative, the rows (or row) to be refreshed are identified by the memory controller. To manually identify these neighboring rows, the memory controller may use the DRAM row adjacency function. For example, the memory controller may access a mode register (MR register) in the DRAM or may use reserved bits in an existing MR to identify the DRAM row adjacency function. The DRAM row adjacency function describes how a logical address for a row maps to the physical row. The row adjacency function depends on the DRAM implementation. In one example, the row adjacency function F(X) equals X/2. In another example, F(X) equals X XOR (RIGHT_SHIFT((X AND 0x8),1) OR (RIGHT_SHIFT(X AND 0x8),2))). It will be appreciated that the row adjacency function thus depends upon a DRAM manufacturer's design. To implement a manual refresh, suppose that a marker command satisfies the threshold probability. The RFN row may be deemed in this example to have an address identified by the variable ROW. The memory controller may then issue a refresh of a neighboring row using an ACT command and a PRE command. For example, the ACT command would be directed to ACT (F(ROW+/−1)). In this fashion, one or both neighboring rows may be successively refreshed. If just the left neighboring row is to be refreshed, the ACT command would be directed to ACT(F(ROW−1)). Similarly, if just the right neighboring row is to be refreshed, the ACT command would be directed to ACT(F(ROW+1)).

Figure 5:
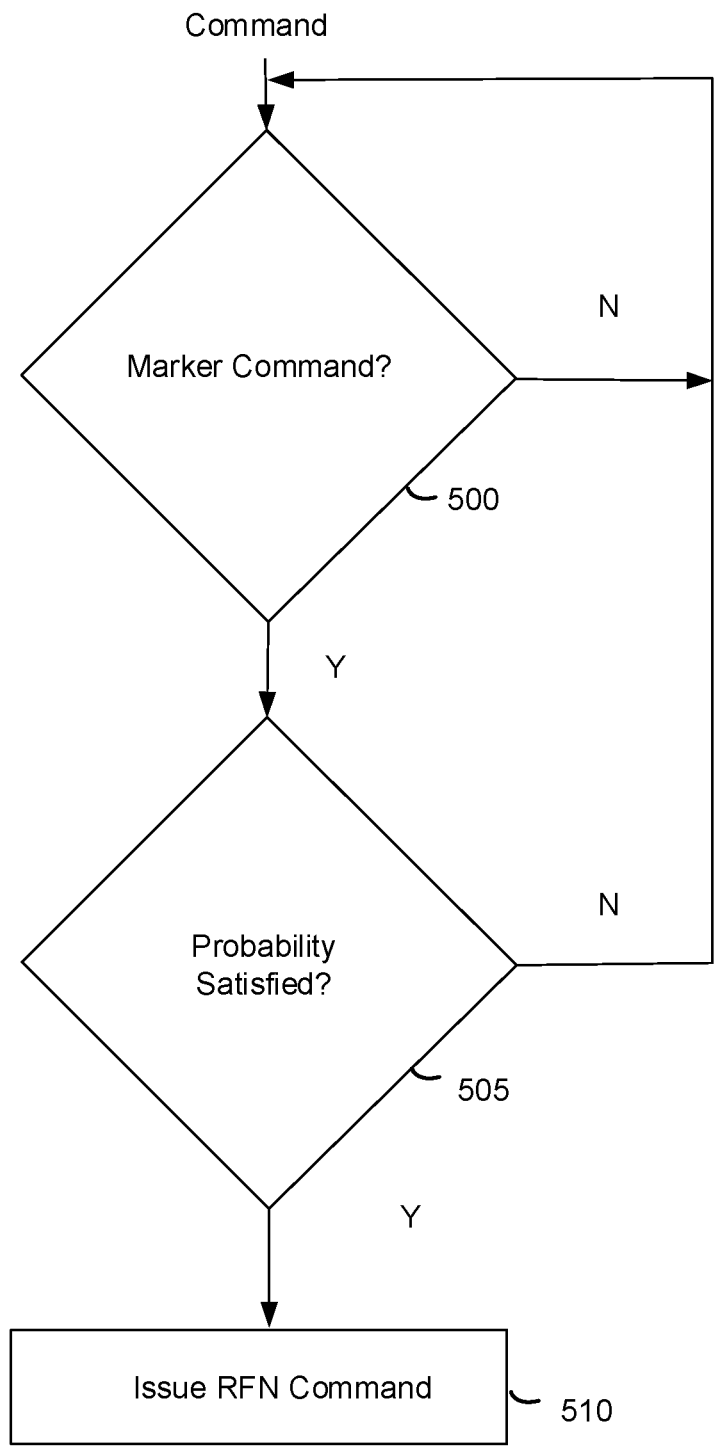
FIG. 5 is a flowchart for an example method of operation for a memory controller with rowhammer mitigation in accordance with an aspect of the disclosure.

A process flow in rowhammer mitigator 220 is illustrated in FIG. 5. In a step 500, a circuit such as a logic circuit in a rowhammer mitigator determines whether a marker command is identified as it enters the queue of commands being processed by the memory controller. If the marker command is not identified, the process returns to step 500 until a marker command is identified. With a marker command identified, a probability engine such as the counter and random number generator discussed previously determines whether a threshold probability is satisfied in a step 505. If the threshold probability is not satisfied, the process returns to step 500. But if the threshold probability is satisfied in step 505, an RFN command is issued in a step 510.

Figure 6:
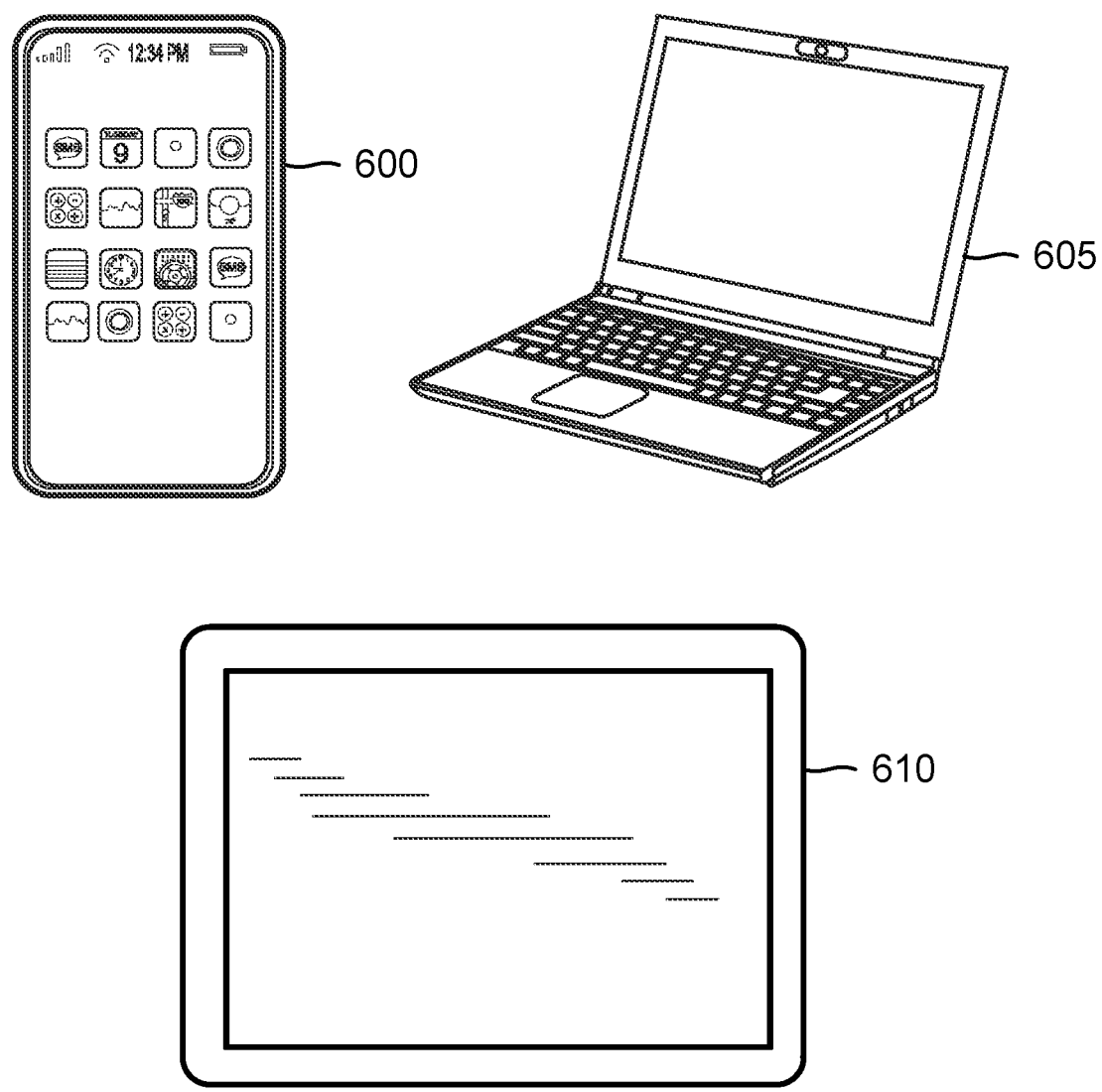
FIG. 6 illustrates some example electronic systems including a memory controller in accordance with an aspect of the disclosure.

A memory controller as disclosed herein may be advantageously incorporated in any suitable mobile device or electronic system. For example, as shown in FIG. 6, a cellular telephone 600, a laptop computer 605, and a tablet PC 610 may all include a DRAM memory controller in accordance with the disclosure. Other exemplary electronic systems such as a music player, a video player, a communication device, and a personal computer may also be configured with memory controllers constructed in accordance with the disclosure.

The disclosure will now be summarized in the following example clauses:

Clause 1. A memory controller for a dynamic random access memory (DRAM), comprising:
- a logic circuit configured to identify a marker command directed to a given row in the DRAM;
- a probability engine configured to determine whether a threshold probability is satisfied responsive to an identification of the marker command; and
- a command generator configured to command the DRAM to refresh one or more rows outside of the given row in response to a satisfaction of the threshold probability.

Clause 2. The memory controller of clause 1, further comprising:
- a command queue, wherein the logic circuit is further configured to identify the marker command from a plurality of commands presented to the command queue.

Clause 3. The memory controller of clause 2, further comprising:
- an arbitrator for arbitrating commands from the command queue.

Clause 4. The memory controller of any of clauses 1-3, wherein the one or more rows comprises a pair of rows.

Clause 5. The memory controller of clause 4, wherein the marker command is a command to pre-charge the given row, and wherein the pair of rows is a pair of neighboring rows to the given row, the probability engine being further configured to assert a refresh field in the marker command to command the DRAM to refresh the pair of neighboring rows in response to the satisfaction of the threshold probability.

Clause 6. The memory controller of clause 4, wherein the marker command is a command to activate the given row, and wherein the pair of rows is a pair of neighboring rows to the given row, the probability engine being further configured to assert a refresh field in the marker command to command the DRAM to refresh both the pair of neighboring rows in response to the satisfaction of the threshold probability.

Clause 7. The memory controller of clause 4, wherein the pair of rows are a pair of neighboring rows to a recently-closed row, the probability engine being further configured to issue a refresh neighboring row (RFN) command to command the DRAM to refresh the pair of the neighboring rows in response to the satisfaction of the threshold probability.

Clause 8. The memory controller of clause 7, wherein the RFN command includes a row address field.

Clause 9. The memory controller of any clauses 1-3, wherein the given row in the DRAM is adjacent a first neighboring row and adjacent a second neighboring row, and wherein the probability engine is further configured to command a refresh of just the first neighboring row or just the second neighboring row in response to the satisfaction of the threshold probability.

Clause 10. The memory controller of clause 9, wherein the probability engine is further configured to issue a pre-charge command having a row left or right field to command a refresh of just the first neighboring row or the second neighboring row.

Clause 11. The memory controller of clause 9, wherein the probability engine is further configured to issue an activation command having a row left or right field to command a refresh of just the first neighboring row or the second neighboring row.

Clause 12. The memory controller of clause 9, wherein the probability engine is further configured to issue a refresh neighboring row (RFN) command having a row left or right field to command a refresh of just the first neighboring row or the second neighboring row.

Clause 13. The memory controller of clause 12, wherein the RFN command includes a row address field having an address of the given row.

Clause 14. The memory controller of any of clauses 1-13, wherein the marker command is a Joint Electron Device Engineering Council (JEDEC) command.

Clause 15. A method for a DRAM memory controller, comprising:
- identifying a marker command directed to a given row in a DRAM;
- in response to an identification of the marker command, determining whether the identification of the marker command is associated with a threshold probability; and
- in response to the threshold probability being satisfied, issuing a command to the DRAM to refresh a neighboring row in the DRAM.

Clause 16. The method of clause 15, wherein issuing the command to the DRAM comprising modifying the marker command.

Clause 17. The method of clause 16, wherein the marker command is a pre-charge command for the given row, and wherein modifying the marker command comprises asserting a refresh field in the pre-charge command.

Clause 18. The method of clause 17, wherein the assertion of the refresh field commands the DRAM to refresh a pair of neighboring rows to the given row.

Clause 19. The method of clause 17, wherein the assertion of the refresh field commands the DRAM to refresh only one neighboring row to the given row.

Clause 20. The method of clause 16, wherein the marker command is activation command for the given row, and wherein modifying the marker command comprises asserting a refresh field in the activation command.

Clause 21. The method of clause 20, wherein the assertion of the refresh field commands the DRAM to refresh a pair of neighboring rows to the given row.

Clause 22. The method of clause 17, wherein the assertion of the refresh field commands the DRAM to refresh only one neighboring row to the given row.

Clause 23. The method of clause 15, wherein issuing the command to the DRAM to refresh the neighboring row comprises issuing a command that is separate from the marker command.

Clause 24. The method of clause 15, wherein issuing the command includes mapping an address for the given row through a row adjacency function to identify a physical location in the DRAM for the neighboring row.

Clause 25. A memory controller for a dynamic random access memory (DRAM), comprising:
a command queue configured to queue a plurality of command to the DRAM to form a queue of commands;
a first pipeline configured to pipeline the queue of command to form a plurality of pipelined commands;
a logic circuit configured to identify a marker command in the plurality of pipelined commands;
a probability engine configured to determine whether a threshold probability is satisfied responsive to an identification of the marker command; and
a command generator configured to modify a command in the plurality of pipelined commands to form a modified command in response to a satisfaction of the threshold probability, the modified command being a command to the DRAM to refresh one or more rows.

Clause 26. The memory controller of clause 25, further comprising:
a second pipeline for the modified command.

Clause 27. The memory controller of any of clauses 25-26, further comprising a timing check circuit configured to check a timing of the plurality of pipelined commands.

Clause 28. The memory controller of any of clauses 25-27, wherein the plurality of pipelined commands comprises a plurality of JEDEC commands.

Clause 29. The memory controller of any of clauses 25-28, wherein the command generator is further configured to assert a flag in the modified command.

30. The memory controller of any of clauses 25-29, wherein the command queue comprises a first-in-first-out (FIFO) buffer.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A memory controller for a dynamic random access memory (DRAM) having a plurality of rows, comprising:
a logic circuit configured to identify an issuance of a specific type of command directed to the DRAM, wherein an identification of the issuance of the specific type of command by the logic circuit is independent of the plurality of rows; and
a probability engine configured to generate an integer random number in response to an initial identification of the specific type of command, the probability engine being further configured to increment a count for each successive identification of the specific type of command; and
a command generator configured to command the DRAM to refresh at least one row in response to the count equaling the integer random number.

2. The memory controller of claim 1, further comprising:
a command queue, wherein the logic circuit is further configured to identify the specific type of command from a plurality of commands presented to the command queue.

3. The memory controller of claim 2, further comprising:
an arbitrator for arbitrating commands from the command queue.

4. The memory controller of claim 1, wherein the at least one row comprises a pair of rows.

5. The memory controller of claim 4, wherein the specific type of command is a command to pre-charge a given row in the DRAM, and wherein the pair of rows is a pair of neighboring rows to the given row, the probability engine being further configured to assert a refresh field in the specific type of command to command the DRAM to refresh the pair of rows in response to the count equaling the positive integer random number.

6. The memory controller of claim 4, wherein the specific type of command is a command to activate a given row in the DRAM, and wherein the pair of rows is a pair of neighboring rows to the given row, the probability engine being further configured to assert a refresh field in the specific type of command to command the DRAM to refresh the pair of neighboring rows in response to the count equaling the positive integer random number.

7. The memory controller of claim 4, wherein the pair of rows are a pair of neighboring rows to a recently-closed row, the probability engine being further configured to issue a refresh neighboring row (RFN) command to command the DRAM to refresh the pair of neighboring rows in response to the count equaling the positive integer random number.

8. The memory controller of claim 7, wherein the RFN command includes a row address field.

9. The memory controller of claim 1, wherein the specific type of command is directed to a given row in the DRAM, and wherein the given row is adjacent a first neighboring row and adjacent a second neighboring row, and wherein the probability engine is further configured to command a refresh of just the first neighboring row or just the second neighboring row in response to the count equaling the positive integer random number.

10. The memory controller of claim 9, wherein the probability engine is further configured to issue a pre-charge command having a row left or right field to command a refresh of just the first neighboring row or the second neighboring row.

11. The memory controller of claim 9, wherein the probability engine is further configured to issue an activation command having a row left or right field to command a refresh of just the first neighboring row or the second neighboring row.

12. The memory controller of claim 9, wherein the probability engine is further configured to issue a refresh neighboring row (RFN) command having a row left or right field to command a refresh of just the first neighboring row or the second neighboring row.

13. The memory controller of claim 12, wherein the RFN command includes a row address field having an address of the given row.

14. The memory controller of claim 1, wherein the specific type of command is a Joint Electron Device Engineering Council (JEDEC) command.

15. A method for a DRAM memory controller, comprising:
identifying an issuance of a specific type of command directed to a DRAM having a plurality of rows, wherein the identifying of the issuance of the specific type of command is independent of the plurality of rows;

in response to an initial identification of the specific type of command, generating a random number to establish a threshold probability;

incrementing a count in response to each subsequent identification of the specific type of command; and in response to the count equaling the random number, issuing a command to the DRAM to refresh a row in the DRAM.

16. The method of claim 15, wherein issuing the command to the DRAM comprising modifying the specific type of command.

17. The method of claim 16, wherein the specific type of command is a pre-charge command for a given row in the DRAM, and wherein modifying the specific type of command comprises asserting a refresh field in the pre-charge command.

18. The method of claim 17, wherein an assertion of the refresh field in the pre-charge command commands the DRAM to refresh a pair of neighboring rows to the given row.

19. The method of claim 17, wherein an assertion of the refresh field in the pre-charge command commands the DRAM to refresh only one neighboring row to the given row.

20. The method of claim 16, wherein the specific type of command is an activation command for a given row in the DRAM, and wherein modifying the specific type of command comprises asserting a refresh field in the activation command.

21. The method of claim 20, wherein an assertion of the refresh field in the activation command commands the DRAM to refresh a pair of neighboring rows to the given row.

22. The method of claim 20, wherein an assertion of the refresh field in the activation command commands the DRAM to refresh only one neighboring row to the given row.

23. The method of claim 15, wherein issuing the command to the DRAM to refresh the row comprises issuing a command that is separate from the specific type of command.

24. The method of claim 15, wherein the specific type of command is directed to a given row in the DRAM, and wherein issuing the command to refresh a row in the DRAM comprises issuing a command to refresh a neighboring row to the given row and includes mapping an address for the given row through a row adjacency function to identify a physical location in the DRAM for the neighboring row.

25. A memory controller for a dynamic random access memory (DRAM) having a plurality of rows, comprising:

a command queue configured to queue a plurality of commands to the DRAM to form a queue of commands;

a first pipeline configured to pipeline the queue of command to form a plurality of pipelined commands;

a logic circuit configured to identify an issuance of a specific type of command in the plurality of pipelined commands, wherein an identification of the issuance of the specific type of command by the logic circuit is independent of the plurality of rows;

a probability engine configured to generate an integer random number in response to an initial identification of the specific type of command and configured to increment a count for each subsequent identification of specific type of command; and a command generator configured to modify a command in the plurality of pipelined commands to form a modified command in response to the count equaling the integer random number, the modified command being a command to the DRAM to refresh one or more rows.

26. The memory controller of claim 25, further comprising:

a second pipeline for the modified command.

27. The memory controller of claim 25, further comprising a timing check circuit configured to check a timing of the plurality of pipelined commands.

28. The memory controller of claim 25, wherein the plurality of pipelined commands comprises a plurality of JEDEC commands.

29. The memory controller of claim 25, wherein the command generator is further configured to assert a flag in the modified command.

30. The memory controller of claim 25, wherein the command queue comprises a first-in-first-out (FIFO) buffer.

* * * * *